United States Patent
Ishizaka et al.

(10) Patent No.: US 7,651,568 B2
(45) Date of Patent: Jan. 26, 2010

(54) PLASMA ENHANCED ATOMIC LAYER DEPOSITION SYSTEM

(75) Inventors: Tadahiro Ishizaka, Clifton Park, NY (US); Tsukasa Matsuda, Delmar, NY (US); Frank M. Cerio, Jr., Schenectady, NY (US); Kaoru Yamamoto, Delmar, NY (US)

(73) Assignee: Tokyo Electron Limited, Tokyo (JP)

( * ) Notice: Subject to any disclaimer, the term of this patent is extended or adjusted under 35 U.S.C. 154(b) by 370 days.

(21) Appl. No.: 11/090,256

(22) Filed: Mar. 28, 2005

(65) Prior Publication Data

US 2006/0213438 A1   Sep. 28, 2006

(51) Int. Cl.
  *C23C 16/505* (2006.01)
  *C23C 16/503* (2006.01)
  *H01L 21/306* (2006.01)

(52) U.S. Cl. .................. 118/715; 118/733; 156/345.33; 156/345.34

(58) Field of Classification Search .................. 118/715, 118/733; 156/345.33, 345.34
See application file for complete search history.

(56) References Cited

U.S. PATENT DOCUMENTS

| | | | | |
|---|---|---|---|---|
| 3,672,207 A * | 6/1972 | Cramp et al. ................. | 73/40.7 |
| 5,578,132 A * | 11/1996 | Yamaga et al. ............... | 118/724 |
| 5,935,336 A * | 8/1999 | Sandhu et al. ......... | 118/723 IR |
| 5,997,963 A * | 12/1999 | Davison et al. ............. | 427/582 |
| 6,074,512 A * | 6/2000 | Collins et al. ........... | 156/345.29 |
| 6,700,089 B1 * | 3/2004 | Hirooka .................... | 219/121.4 |
| 6,772,827 B2 * | 8/2004 | Keller et al. ................... | 165/53 |
| 2003/0200929 A1 * | 10/2003 | Otsuki ..................... | 118/723 R |
| 2004/0017049 A1 * | 1/2004 | Fink ............................ | 277/627 |
| 2004/0082251 A1 * | 4/2004 | Bach et al. ..................... | 445/60 |
| 2005/0016687 A1 * | 1/2005 | Shinriki et al. .......... | 156/345.52 |

* cited by examiner

*Primary Examiner*—Jeffrie R Lund
*Assistant Examiner*—Satish Chandra
(74) *Attorney, Agent, or Firm*—Oblon, Spivak, McClelland, Maier & Neustadt, L.L.P.

(57) ABSTRACT

A plasma enhanced atomic layer deposition (PEALD) system includes a first chamber component coupled to a second chamber component to provide a processing chamber defining an isolated processing space within the processing chamber. A substrate holder is provided within the processing chamber and configured to support a substrate, a first process material supply system is configured to supply a first process material to the processing chamber and a second process material supply system is configured to supply a second process material to the processing chamber. A power source is configured to couple electromagnetic power to the processing chamber, and a sealing assembly interposed between the first and second chamber components. The sealing assembly includes a plurality of sealing members configured to reduce the amount of external contaminants permeating through an interface of the first and second components into the isolated processing space of the processing chamber, wherein the film is formed on the substrate by alternatingly introducing the first process material and the second process material.

20 Claims, 11 Drawing Sheets

PLASMA ENHANCED ATOMIC LAYER DEPOSITION SYSTEM

BACKGROUND OF THE INVENTION

1. Field of Invention

The present invention relates to a plasma enhanced atomic layer deposition system, and more particularly to a plasma enhanced atomic layer deposition system configured to have reduced contamination problems.

2. Description of Related Art

Typically, during materials processing, plasma is employed to facilitate the addition and removal of material films when fabricating composite material structures. For example, in semiconductor processing, a (dry) plasma etch process is utilized to remove or etch material along fine lines or within vias or contacts patterned on a silicon substrate. Alternatively, for example, a vapor deposition process is utilized to deposit material along fine lines or within vias or contacts on a silicon substrate. In the latter, vapor deposition processes include chemical vapor deposition (CVD), and plasma enhanced chemical vapor deposition (PECVD).

In PECVD, plasma is utilized to alter or enhance the film deposition mechanism. For instance, plasma excitation generally allows film-forming reactions to proceed at temperatures that are significantly lower than those typically required to produce a similar film by thermally excited CVD. In addition, plasma excitation may activate film-forming chemical reactions that are not energetically or kinetically favored in thermal CVD. The chemical and physical properties of PECVD films may thus be varied over a relatively wide range by adjusting process parameters.

More recently, atomic layer deposition (ALD), a form of PECVD or more generally CVD, has emerged as a candidate for ultra-thin gate film formation in front end-of-line (FEOL) operations, as well as ultra-thin barrier layer and seed layer formation for metallization in back end-of-line (BEOL) operations. In ALD, two or more process gasses are introduced alternately and sequentially in order to form a material film one monolayer at a time. Such an ALD process has proven to provide improved uniformity and control in layer thickness, as well as conformality to features on which the layer is deposited. However, current ALD processes often suffer from contamination problems that affect the quality of the deposited films, and thus the manufactured device. Such contamination problems have been an impediment to wide acceptance of ALD films despite their superior characteristics.

SUMMARY OF THE INVENTION

Accordingly, one object of the present invention is directed to addressing any of the above-described and/or other problems with ALD systems and processes.

Another object of the present invention is to reduce contamination problems relating to deposition of ALD films.

These and/or other objects of the present invention may be provided by a plasma enhanced atomic layer deposition (PEALD) system including a first chamber component coupled to a second chamber component to provide a processing chamber defining an isolated processing space within the processing chamber. Also included is a substrate holder provided within the processing chamber, and configured to support a substrate, a first process material supply system configured to supply a first process material to the processing chamber and a second process material supply system configured to supply a second process material to the processing chamber. A power source is configured to couple electromagnetic power to the processing chamber, and a sealing assembly is interposed between the first and second chamber components. The sealing assembly includes a plurality of sealing members configured to reduce the amount of external contaminants permeating through an interface of the first and second components into the isolated processing space of the processing chamber, wherein the film is formed on the substrate by alternatingly introducing the first process material and the second process material.

Another aspect of the invention includes a plasma enhanced atomic layer deposition (PEALD) system having a first chamber component coupled to a second chamber component to provide a processing chamber defining an isolated processing space within the processing chamber. Also included is means provided within the processing chamber for supporting a substrate, means for supplying a first process material to the processing chamber and means for supplying a second process material to the processing chamber. Also included is means for generating and coupling electromagnetic power to the processing chamber while the second process material supply system supplies the second process material to the process chamber, in order to accelerate a reduction reaction at a surface of the substrate. Means for sealing is interposed between the first and second chamber components to reduce the amount of external contaminants permeating through an interface of the first and second components into the isolated processing space of the processing chamber, wherein the film is formed on the substrate by alternatingly introducing the first process material and the second process material.

DETAILED DESCRIPTION OF PREFERRED EMBODIMENTS

In the following description, in order to facilitate a thorough understanding of the invention and for purposes of explanation and not limitation, specific details are set forth, such as a particular geometry of the deposition system and descriptions of various components. However, it should be understood that the invention may be practiced in other embodiments that depart from these specific details.

Figure 1:
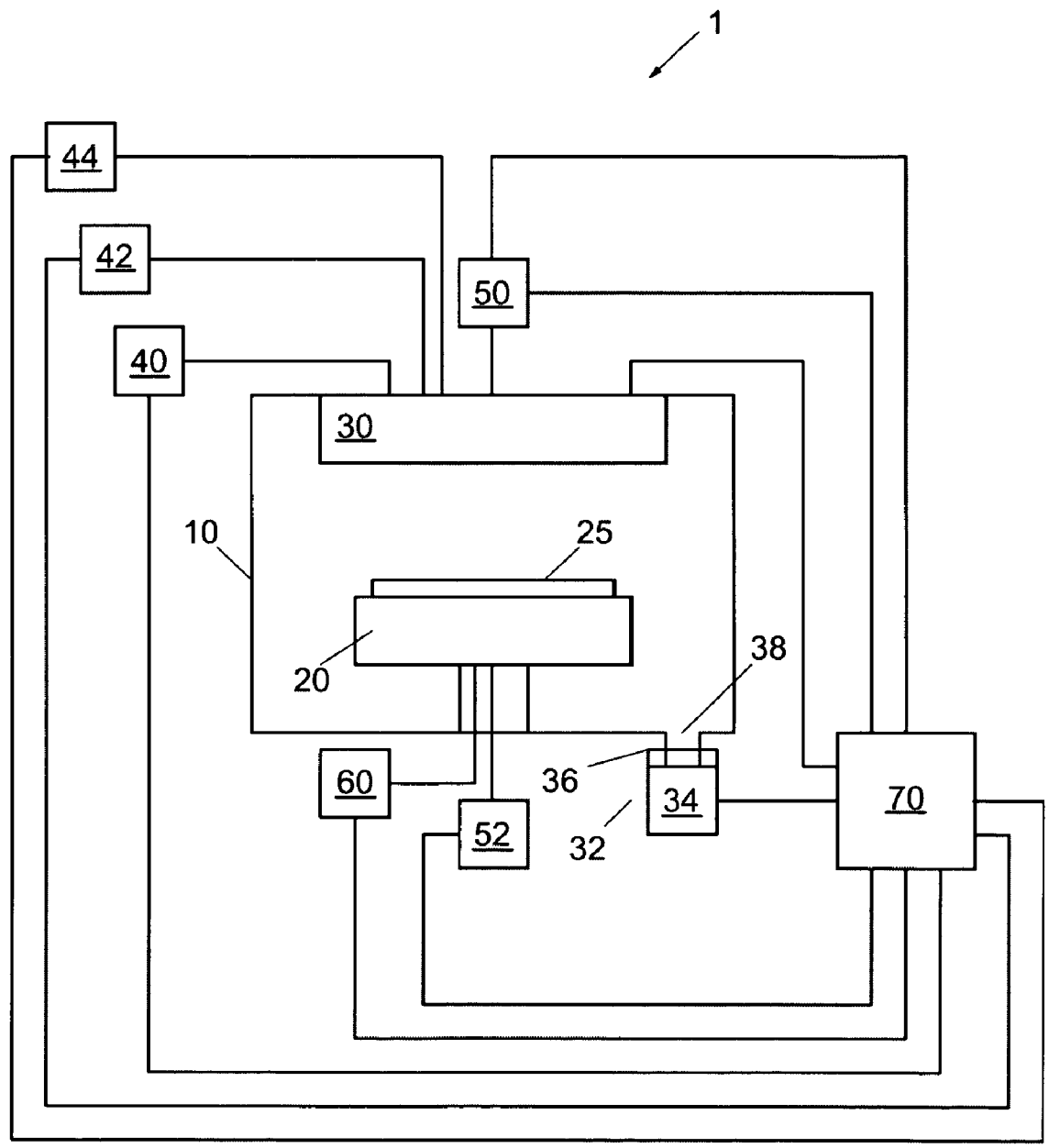
FIG. 1 depicts a schematic view of a deposition system in accordance with an embodiment of the invention.

Referring now to the drawings, wherein like reference numerals designate identical or corresponding parts throughout the several views, FIG. 1 illustrates a deposition system 1 for depositing a thin film on a substrate according to one embodiment. For example, during the metallization of interconnect and intra-connect structures for semiconductor devices in back-end-of-line (BEOL) operations, a thin conformal barrier layer may be deposited on wiring trenches or vias to minimize the migration of metal into the inter-level or intra-level dielectric. Further, a thin conformal seed layer may be deposited on wiring trenches or vias to provide a film with acceptable adhesion properties for bulk metal fill, or a thin conformal adhesion layer may be deposited on wiring trenches or vias to provide a film with acceptable adhesion properties for metal seed deposition. In front-end-of line (FEOL) operations, the deposition system 1 may be used to deposit an ultra thin gate layer, and/or a gate dielectric layer such as a high-K film.

The deposition system 1 comprises a process chamber 10 having a substrate holder 20 configured to support a substrate 25, upon which the thin film is formed. The process chamber 10 further comprises an upper assembly 30 coupled to a first process material supply system 40, a second process material supply system 42, and a purge gas supply system 44. Additionally, the deposition system 1 comprises a first power source 50 coupled to the process chamber 10 and configured to generate plasma in the process chamber 10, and a substrate temperature control system 60 coupled to substrate holder 20 and configured to elevate and control the temperature of substrate 25. Additionally, deposition system 1 comprises a controller 70 that can be coupled to process chamber 10, substrate holder 20, upper assembly 30, first process material supply system 40, second process material supply system 42, purge gas supply system 44, first power source 50, and substrate temperature control system 60.

Alternately, or in addition, controller 70 can be coupled to one or more additional controllers/computers (not shown), and controller 70 can obtain setup and/or configuration information from an additional controller/computer.

In FIG. 1, singular processing elements (10, 20, 30, 40, 42, 44, 50, and 60) are shown, but this is not required for the invention. The deposition system 1 can comprise any number of processing elements having any number of controllers associated with them in addition to independent processing elements.

The controller 70 can be used to configure any number of processing elements (10, 20, 30, 40, 42, 44, 50, and 60), and the controller 70 can collect, provide, process, store, and display data from processing elements. The controller 70 can comprise a number of applications for controlling one or more of the processing elements. For example, controller 70 can include a graphic user interface (GUI) component (not shown) that can provide easy to use interfaces that enable a user to monitor and/or control one or more processing elements.

Referring still to FIG. 1, the deposition system 1 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Therefore, while aspects of the invention will be described in connection with the processing of a semiconductor substrate, the invention is not limited solely thereto.

The first process material supply system 40 and the second process material supply system 42 are configured to alternatingly and cyclically introduce a first process material to process chamber 10 and a second process material to process chamber 10. The first process material can, for example, comprise a film precursor, such as a composition having the principal atomic or molecular species found in the film formed on substrate 25. For instance, the film precursor can originate as a solid phase, a liquid phase, or a gaseous phase, and it may be delivered to process chamber 10 in a gaseous phase with or without the use of a carrier gas. The second process material can, for example, comprise a reducing agent, which may also include atomic or molecular species found in the film formed on substrate 25. For instance, the reducing agent can originate as a solid phase, a liquid phase, or a gaseous phase, and it may be delivered to process chamber 10 in a gaseous phase with or without the use of a carrier gas.

Additionally, the purge gas supply system 44 can be configured to introduce a purge gas to process chamber 10 between introduction of the first process material and the second process material to process chamber 10, respectively. The purge gas can comprise an inert gas, such as a Noble gas (i.e., helium, neon, argon, xenon, krypton) nitrogen or hydrogen, or a combination of two or more of these gases. The purge gas supply system 44 can also be configured to introduce a reactive purge gas.

Referring still to FIG. 1, the deposition system 1 comprises a plasma generation system configured to generate a plasma during at least a portion of the alternating and cyclical introduction of the first process material and the second process material to process chamber 10. The plasma generation system can include a first power source 50 coupled to the process chamber 10, and configured to couple power to the first process material, or the second process material, or both in process chamber 10. The first power source 50 may be a variable power source and may include a radio frequency (RF) generator and an impedance match network, and may further include an electrode through which RF power is coupled to the plasma in process chamber 10. The electrode can be formed in the upper assembly 30, and it can be configured to oppose the substrate holder 20. The impedance match network can be configured to optimize the transfer of RF power from the RF generator to the plasma by matching the output impedance of the match network with the input impedance of the process chamber, including the electrode, and plasma. For instance, the impedance match network serves to improve the transfer of RF power to plasma in plasma process chamber 10 by reducing the reflected power. Match network topologies (e.g. L-type, π-type, T-type, etc.) and automatic control methods are well known to those skilled in the art.

Alternatively, the first power source 50 may include a radio frequency (RF) generator and an impedance match network, and may further include an antenna, such as an inductive coil, through which RF power is coupled to plasma in process chamber 10. The antenna can, for example, include a helical or solenoidal coil, such as in an inductively coupled plasma source or helicon source, or it can, for example, include a flat coil as in a transformer coupled plasma source.

Alternatively, the first power source 50 may include a microwave frequency generator, and may further include a microwave antenna and microwave window through which microwave power is coupled to plasma in process chamber 10. The coupling of microwave power can be accomplished using electron cyclotron resonance (ECR) technology, or it may be employed using surface wave plasma technology, such as a slotted plane antenna (SPA), as described in U.S. Pat. No. 5,024,716, entitled "Plasma processing apparatus for etching, ashing, and film-formation"; the contents of which are herein incorporated by reference in its entirety.

Optionally, the deposition system 1 comprises a substrate bias generation system configured to generate or assist in generating a plasma during at least a portion of the alternating and cyclical introduction of the first process material and the second process material to process chamber 10. The substrate bias system can include a substrate power source 52 coupled to the process chamber 10, and configured to couple power to substrate 25. The substrate power source 52 may include a radio frequency (RF) generator and an impedance match network, and may further include an electrode through which RF power is coupled to substrate 25. The electrode can be formed in substrate holder 20. For instance, substrate holder 20 can be electrically biased at a RF voltage via the transmission of RF power from a RF generator (not shown) through an impedance match network (not shown) to substrate holder 20. A typical frequency for the RF bias can range from about 0.1 MHz to about 100 MHz. RF bias systems for plasma processing are well known to those skilled in the art. Alternately, RF power is applied to the substrate holder electrode at multiple frequencies.

Although the plasma generation system and the optional substrate bias system are illustrated in FIG. 1 as separate entities, they may indeed comprise one or more power sources coupled to substrate holder 20.

Still referring to FIG. 1, deposition system 1 comprises substrate temperature control system 60 coupled to the substrate holder 20 and configured to elevate and control the temperature of substrate 25. Substrate temperature control system 60 comprises temperature control elements, such as a cooling system including a re-circulating coolant flow, in one or more separate cooling channels in the substrate holder 120, that receives heat from substrate holder 120 and transfers heat to one or more heat exchanger systems (not shown), or when heating, transfers heat from one or more heat exchanger systems. Additionally, the temperature control elements can include heating/cooling elements, such as resistive heating elements, or thermoelectric heaters/coolers, which can be included in the substrate holder 20, as well as the chamber wall of the processing chamber 10 and any other component within the deposition system 1. The temperature control system 60 may also be coupled to a contaminant shield in accordance with an embodiment of the invention, as will be discussed below with respect to FIG. 8.

In order to improve the thermal transfer between substrate 25 and substrate holder 20, substrate holder 20 can include a mechanical clamping system, or an electrical clamping system, such as an electrostatic clamping system, to affix substrate 25 to an upper surface of substrate holder 20. Furthermore, substrate holder 20 can further include a substrate backside gas delivery system configured to introduce gas to the back-side of substrate 25 in order to improve the gas-gap thermal conductance between substrate 25 and substrate holder 20. Such a system can be utilized when temperature control of the substrate is required at elevated or reduced temperatures. For example, the substrate backside gas system can comprise a two-zone gas distribution system, wherein the helium gas gap pressure can be independently varied between the center and the edge of substrate 25.

Furthermore, the process chamber 10 is further coupled to a pressure control system 32, including a vacuum pumping system 34 and a valve 36, through a duct 38, wherein the pressure control system 34 is configured to controllably evacuate the process chamber 10 to a pressure suitable for forming the thin film on substrate 25, and suitable for use of the first and second process materials. Moreover, the pressure control system 32 may be coupled to a sealing assembly in accordance with an embodiment of the present invention, as will be discussed in relation to FIG. 4 below.

The vacuum pumping system 34 can include a turbo-molecular vacuum pump (TMP) or cryogenic pump capable of a pumping speed up to about 5000 liters per second (and greater) and valve 36 can include a gate valve for throttling the chamber pressure. In conventional plasma processing devices utilized for dry plasma etch, a 1000 to 3000 liter per second TMP is generally employed. Moreover, a device for monitoring chamber pressure (not shown) can be coupled to the processing chamber 10. The pressure measuring device can be, for example, a Type 628B Baratron absolute capacitance manometer commercially available from MKS Instruments, Inc. (Andover, Mass.).

Still referring to FIG. 1, controller 70 can comprise a microprocessor, memory, and a digital I/O port capable of generating control voltages sufficient to communicate and activate inputs to deposition system 1 as well as monitor outputs from deposition system 1. Moreover, the controller 70 may be coupled to and may exchange information with the process chamber 10, substrate holder 20, upper assembly 30, first process material supply system 40, second process material supply system 42, purge gas supply system 44, first power source 50, second power source 52, substrate temperature controller 60, and pressure control system 32. For example, a program stored in the memory may be utilized to activate the inputs to the aforementioned components of the deposition system 1 according to a process recipe in order to perform an etching process, or a deposition process. One example of the controller 70 is a DELL PRECISION WORKSTATION 610™, available from Dell Corporation, Austin, Tex.

The controller 70 may be locally located relative to the deposition system 1, or it may be remotely located relative to the deposition system 1. For example, the controller 70 may exchange data with the deposition 1 using at least one of a direct connection, an intranet, the Internet and a wireless connection. The controller 70 may be coupled to an intranet at, for example, a customer site (i.e., a device maker, etc.), or it may be coupled to an intranet at, for example, a vendor site (i.e., an equipment manufacturer). Additionally, for example, the controller 70 may be coupled to the Internet. Furthermore, another computer (i.e., controller, server, etc.) may access, for example, the controller 70 to exchange data via at least one of a direct connection, an intranet, and the Internet. As also would be appreciated by those skilled in the art, the controller 70 may exchange data with the deposition system 1 via a wireless connection.

Figure 2:
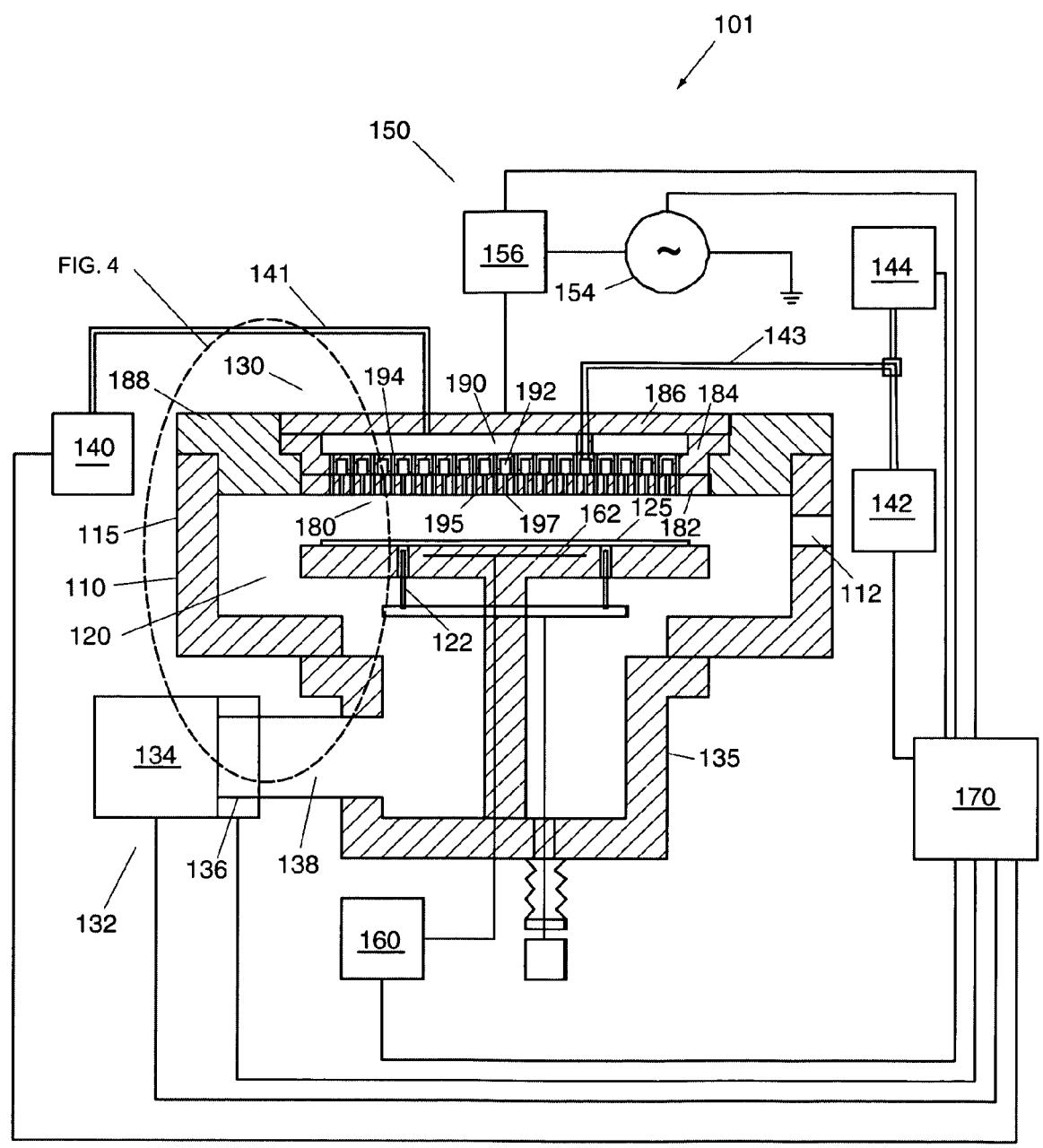
FIG. 2 depicts a schematic view of a deposition system in accordance with another embodiment of the invention.

Referring now to FIG. 2, there is shown a deposition system 101 on which embodiments of the present invention may be implemented. The deposition system 101 of FIG. 2 comprises a process chamber 110 having a substrate holder 120 configured to support a substrate 125, upon which the thin film is formed. As seen within the dashed oval of FIG. 2, the process chamber 110 includes process chamber wall 115 coupled to a separate upper assembly 130 and a separate lower assembly 135. Details of this coupling of the chamber wall will be further discussed with respect to the specific embodiment of FIG. 4 below. The upper assembly 130 is coupled to a first process material supply system 140, a second process material supply system 142, and a purge gas supply system 144. Additionally, the deposition system 101 comprises a first power source 150 coupled to the process chamber 110 and configured to generate plasma in the process chamber 110, and a substrate temperature control system 160 coupled to substrate holder 120 and configured to elevate and control the temperature of substrate 125. Additionally, deposition system 101 comprises a controller 170 that can be coupled to process chamber 110, substrate holder 120, upper assembly 130, first process material supply system 140, second process material supply system 142, purge gas supply system 144, first power source 150, and substrate temperature control system 160. The controller 170 may be implemented, for example, as the controller 70 described with respect to FIG. 1 above.

The deposition system 101 may be configured to process 200 mm substrates, 300 mm substrates, or larger-sized substrates. In fact, it is contemplated that the deposition system may be configured to process substrates, wafers, or LCDs regardless of their size, as would be appreciated by those skilled in the art. Substrates can be introduced to process chamber 110 through passage 112, and they may be lifted to and from an upper surface of substrate holder 120 via substrate lift system 122.

The first process material supply system 140 and the second process material supply system 142 are configured to alternatingly and cyclically introduce a first process material to process chamber 110 and a second process material to process chamber 110. The first process material can, for example, comprise a film precursor, such as a composition having the principal atomic or molecular species found in the film formed on substrate 125. For instance, the film precursor can originate as a solid phase, a liquid phase, or a gaseous phase, and it may be delivered to process chamber 10 in a gaseous phase, and with or without a carrier gas. The second process material can, for example, comprise a reducing agent, which may also have atomic or molecular species found in the film formed on substrate 125. For instance, the reducing agent can originate as a solid phase, a liquid phase, or a gaseous phase, and it may be delivered to process chamber 110 in a gaseous phase, and with or without a carrier gas.

Additionally, the purge gas supply system 144 can be configured to introduce a purge gas to process chamber 110 between introduction of the first process material and the second process material to process chamber 110, respectively. The purge gas can comprise an inert gas, such as a Noble gas (i.e., helium, neon, argon, xenon, krypton) nitrogen or hydrogen or a combination of two of more of these gases. In one embodiment, the purge gas supply system 144 can also be configured to introduce a reactive purge gas in to chamber 110 as will be further described herein.

The first material supply system 140, the second material supply system 142, and the purge gas supply system 144 can include one or more material sources, one or more pressure control devices, one or more flow control devices, one or more filters, one or more valves, or one or more flow sensors. As discussed with respect to FIG. 1, the flow control devices can include pneumatic driven valves, electromechanical (solenoidal) valves, and/or high-rate pulsed gas injection valves. An exemplary pulsed gas injection system is described in greater detail in pending U.S. application 60/272,452, filed on Mar. 2, 2001, the entire contents of which is incorporated herein by reference in its entirety.

Referring still to FIG. 2, the first process material is coupled to process chamber 110 through first material line 141, and the second process material is coupled to process chamber 110 through second material line 143. Additionally, the purge gas may be coupled to process chamber 110 through the first material line 141 (as shown), the second material line 143 (as shown), or an independent line, or any combination thereof. In the embodiment of FIG. 2, the first process material, second process material, and purge gas are introduced and distributed within process chamber 110 through the upper assembly 130 that includes gas injection assembly 180. While not shown in FIG. 2, a sidewall gas injection valve may also be included in the processing system. The gas injection assembly 180 may comprise a first injection plate 182, a second injection plate 184, and a third injection plate 186, which are electrically insulated from process chamber 110 by insulation assembly 188. The first process material is coupled from the first process material supply system 140 to process chamber 110 through a first array of through-holes 194 in the second injection plate 184 and a first array of orifices 195 in the first injection plate 182 via a first plenum 190 formed between the second injection plate 184 and the third injection plate 186. The second process material, or purge gas, or both is coupled from the second process material supply system 142 or purge gas supply system 144 to process chamber 110 through a second array of orifices 197 in the first injection plate 182 via a second plenum 192 formed in the second injection plate 184.

Referring still to FIG. 2, the deposition system 101 comprises a plasma generation system configured to generate a plasma during at least a portion of the alternating and cyclical introduction of the first process material and the second process material to process chamber 110. The plasma generation system can include a first power source 150 coupled to the process chamber 110, and configured to couple power to the first process material, or the second process material, or both in process chamber 110. The first power source 150 may be variable and includes a radio frequency (RF) generator 154 and an impedance match network 156, and further includes an electrode, such as gas injection assembly 180, through which RF power is coupled to plasma in process chamber 110. The electrode is formed in the upper assembly 130 and is insulated from process chamber 110 via insulation assembly 188, and it can be configured to oppose the substrate holder 120. The RF frequency can, for example, range from approximately 100 kHz to approximately 100 MHz. Alternatively, the RF frequency can, for example, range from approximately 400 kHz to approximately 60 MHz. By way of further example, the RF frequency can, for example, be approximately 27.12 MHz.

Still referring to FIG. 2, deposition system 101 comprises substrate temperature control system 160 coupled to the substrate holder 120 and configured to elevate and control the temperature of substrate 125. Substrate temperature control system 160 comprises at least one temperature control element 162, including a resistive heating element such as an aluminum nitride heater. The substrate temperature control system 160 can, for example, be configured to elevate and control the substrate temperature up to from approximately 350° to 400° C. Alternatively, the substrate temperature can, for example, range from approximately 150° C. to 350° C. It is to be understood, however, that the temperature of the substrate is selected based on the desired temperature for causing ALD deposition of a particular material on the surface of a given substrate. Therefore, the temperature can be higher or lower than described above. As with the embodiment of FIG. 1, the temperature control system 160 may also be coupled to a contaminant shield in accordance with an embodiment of the invention, as will be discussed below with respect to FIG. 8.

Furthermore, the process chamber 110 is further coupled to a pressure control system 132, including a vacuum pumping system 134 and a valve 136, through a duct 138, wherein the pressure control system 134 is configured to controllably evacuate the process chamber 110 to a pressure suitable for forming the thin film on substrate 125, and suitable for use of the first and second process materials. Moreover, the pressure control system 132 may be coupled to a sealing assembly in accordance with an embodiment of the present invention, as will be discussed in relation to FIG. 4 below.

Figure 3:
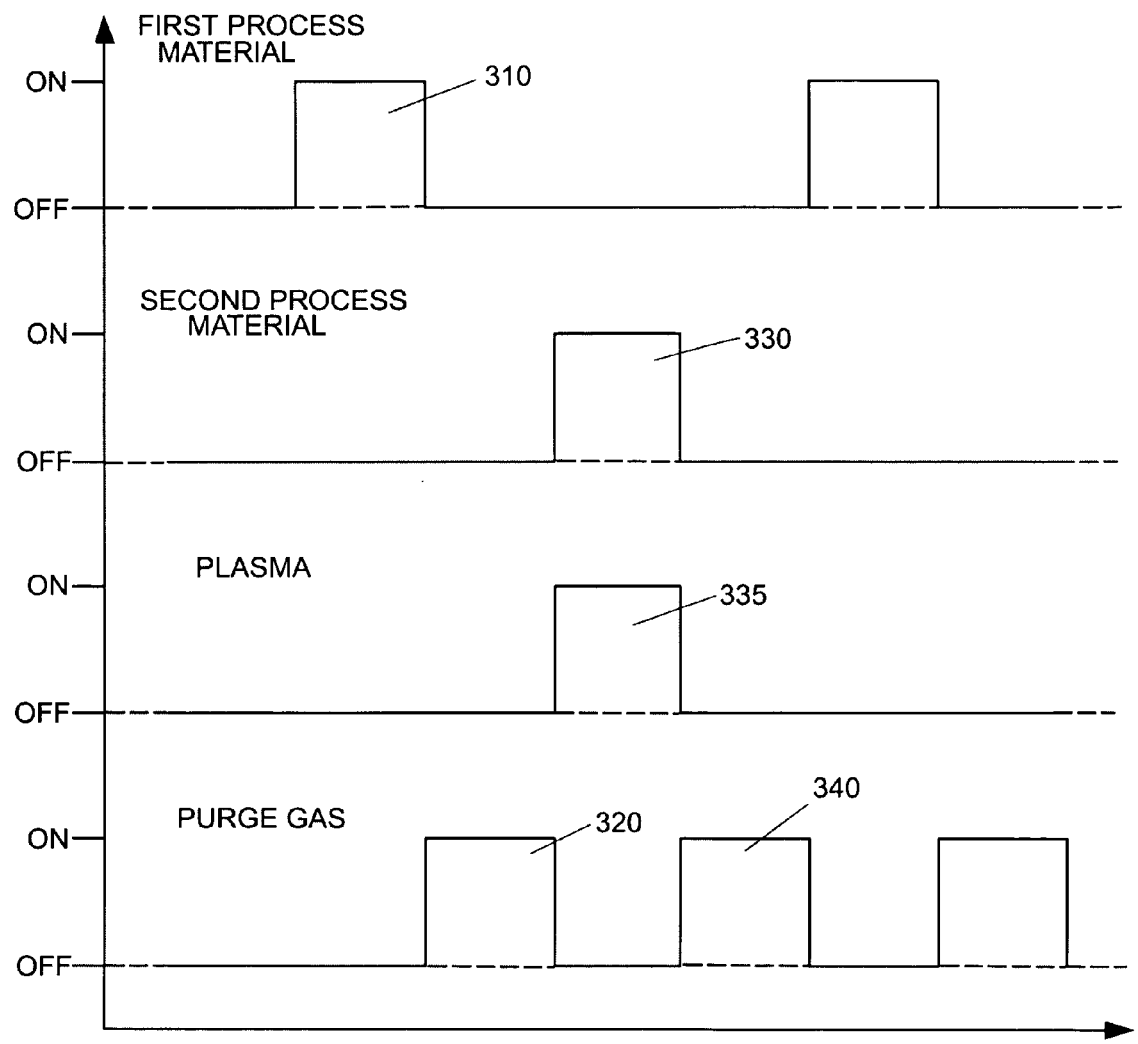
FIG. 3 is a timing diagram for an exemplary ALD process according to an embodiment of the invention.

FIG. 3 is a timing diagram for an exemplary plasma enhanced atomic layer deposition (PEALD) process that may be performed in a PEALD processing system in accordance with an embodiment of the present invention. As seen in this figure, a first process material is introduced to a process chamber, such as the chamber 10 or 110 (components noted by 10/110 below), for a first period of time 310 in order to deposit such material on exposed surfaces of substrate 25/125. The first process material is preferably a chemically volatile but thermally stable material that can be deposited on the substrate surface in a self limiting manner. The nature of such deposition depends on the composition of the first process material and the substrate being processed. For example, the first process material can be either or both of absorbed or chemically bonded with the substrate surface.

In the embodiment of FIG. 3, after the first process material is deposited on the substrate surface, the process chamber 10/110 is purged with a purge gas for a second period of time 320. Thereafter, a reducing agent (second process material), is introduced to process chamber 10/110 for a third period of time 330 while power is coupled through the upper assembly 30/130 from the first power source 50/150 to the reducing agent as shown by 335. The second process material is provided in the processing chamber to provide a reduction reaction with the deposited first process material in order to form a desired film on the substrate surface. Thus, the second process material preferably reacts aggressively with the first process material deposited on the substrate. The coupling of power to the reducing agent heats the reducing agent, thus causing ionization and dissociation of the reducing agent in order to form a radical that chemically reacts with the first precursor adsorbed (and/or bonded) on substrate 25/125. When substrate 25/125 is heated to an elevated temperature, the surface chemical reaction facilitates the formation of the desired film. The process chamber 10/110 is then purged with a purge gas for a fourth period of time 340. The introduction of the first and second process materials, and the formation of plasma can be repeated any number of times to produce a film of desired thickness on the substrate.

The first process material and the second process material are chosen in accordance with the composition and characteristics of a material to be deposited on the substrate. For example, during the deposition of tantalum (Ta) as a barrier layer, the first process material can include a solid film precursor, such as tantalum pentachloride ($TaCl_5$), and the second process material can include a reducing agent, such as hydrogen ($H_2$) gas. In another example, during the deposition of tantalum nitride (TaN) or tantalum carbonitride (TaCN) as a barrier layer, the first process material can include a metal organic film precursor, such as tertiary amyl imido-tris-dimethylamido tantalum ($Ta(NC(CH_3)_2C_2H_5)(N(CH_3)_2)_3$, hereinafter referred to as Taimata®); for additional details, see U.S. Pat. No. 6,593,484), and the second process material can include a reducing agent, such as hydrogen ($H_2$), ammonia ($NH_3$), silane ($SiH_4$), or disilane ($Si_2H_6$), or a combination thereof. In another example, when depositing tantalum nitride (i.e., $TaN_x$), the first precursor can include a tantalum-containing precursor, such as $TaCl_5$, PDEAT (pentakis(diethylamido) tantalum), PEMAT (pentakis(ethylmethylamido) tantalum), $TaBr_5$, or TBTDET (t-butylimino tris (diethylamino) tantalum). The second precursor can include a mixture of $H_2$ and $N_2$, or $NH_3$. Still further, when depositing tantalum pentoxide, the first process material can include $TaCl_5$, and the second process material can include $H_2O$, or $H_2$ and $O_2$.

In another example, when depositing tantalum (Ta), tantalum nitride, or tantalum carbonitride, the first process material can include $TaF_5$, $TaCl_5$, $TaBr_5$, $TaI_5$, $Ta(CO)_5$, $Ta[N(C_2H_5CH_3)]_5$ (PEMAT), $Ta[N(CH_3)_2]_5$ (PDMAT), $Ta[N(C_2H_5)_2]_5$ (PDEAT), $Ta(NC(CH_3)_3)(N(C_2H_5)_2)_3$ (TBTDET), $Ta(NC_2H_5)(N(C_2H_5)_2)_3$, $Ta(NC(CH_3)_2C_2H_5)(N(CH_3)_2)_3$, or $Ta(NC(CH_3)_3)(N(CH_3)_2)_3$, and the second process material can include $H_2$, $NH_3$, $N_2$ and $H_2$, $N_2H_4$, $NH(CH_3)_2$, or $N_2H_3CH_3$.

In another example, when depositing titanium (Ti), titanium nitride, or titanium carbonitride, the first process material can include $TiF_4$, $TiCl_4$, $TiBr_4$, $TiI_4$, $Ti[N(C_2H_5CH_3)]_4$ (TEMAT), $Ti[N(CH_3)_2]_4$ (TDMAT), or $Ti[N(C_2H_5)_2]_4$ (TDEAT), and the second process material can include $H_2$, $NH_3$, $N_2$ and $H_2$, $N_2H_4$, $NH(CH_3)_2$, or $N_2H_3CH_3$.

As another example, when depositing tungsten (W), tungsten nitride, or tungsten carbonitride, the first process material can include $WF_6$, or $W(CO)_6$, and the second process material can include $H_2$, $NH_3$, $N_2$ and $H_2$, $N_2H_4$, $NH(CH_3)_2$, or $N_2H_3CH_3$.

In another example, when depositing molybdenum (Mo), the first process material can include molybdenum hexafluoride ($MoF_6$), and the second process material can include $H_2$.

When depositing copper, the first process material can include organometallic compounds, such as Cu(TMVS)(hfac), also known by the trade name CupraSelect®, available from Schumacher, a unit of Air Products and Chemicals, Inc., 1969 Palomar Oaks Way, Carlsbad, Calif. 92009), or inorganic compounds, such as CuCl. The second process material can include at least one of $H_2$, $O_2$, $N_2$, $NH_3$, or $H_2O$. As used herein, the term "at least one of A, B, C, . . . or X" refers to any one of the listed elements or any combination of more than one of the listed elements.

In another example, when depositing $ZrO_2$, the first process material can include $Zr(NO_3)_4$, or $ZrCl_4$, and the second process material can include $H_2O$.

When depositing $HfO_2$, the first process material can include $Hf(OBut)_4$, $Hf(NO_3)_4$, or $HfCl_4$, and the second process material can include $H_2O$. In another example, when depositing hafnium (Hf), the first process material can include $HfCl_4$, and the second process material can include $H_2$.

In still another example, when depositing niobium (Nb), the first process material can include niobium pentachloride ($NbCl_5$), and the second process material can include $H_2$.

In another example, when depositing zinc (Zn), the first process material can include zinc dichloride ($ZnCl_2$), and the second process material can include $H_2$.

In another example, when depositing $SiO_2$, the first process material can include $Si(OC_2H_5)_4$, $SiH_2Cl_2$, $SiCl_4$, or $Si(NO_3)_4$, and the second process material can include $H_2O$ or $O_2$. In another example, when depositing silicon nitride, the first process material can include $SiCl_4$, or $SiH_2Cl_2$, and the second process material can include $NH_3$, or $N_2$ and $H_2$. In another example, when depositing TiN, the first process material can include titanium nitrate (Ti($NO_3$)), and the second process material can include $NH_3$.

In another example, when depositing aluminum, the first process material can include aluminum chloride ($Al_2Cl_6$), or trimethylaluminum (Al($CH_3$)$_3$), and the second process material can include $H_2$. When depositing aluminum nitride, the first process material can include aluminum trichloride, or trimethylaluminum, and the second process material can include $NH_3$, or $N_2$ and $H_2$. In another example, when depositing aluminum oxide, the first process material can include aluminum chloride, or trimethylaluminum, and the second process material can include $H_2O$, or $O_2$ and $H_2$.

In still another example, when depositing GaN, the first process material can include gallium nitrate (Ga($NO_3$)$_3$), or trimethylgallium (Ga($CH_3$)$_3$), and the second process material can include $NH_3$.

While FIG. 3 shows discrete pulses of the first process material, the first process material may be a continuous flow, for example on a carrier gas, where such continuous flow will not cause undesirable reaction with the second process material prior to deposition on the substrate surface. While FIG. 3 shows plasma generation only during the reduction gas period, a plasma may also be generated during the first process material period in order to facilitate adsorption and/or chemical bonding of the first process material to the substrate surface. Moreover, although the second process material time period 330 and the plasma time period 335 are shown in FIG. 3 to exactly correspond to one another, it is sufficient for purposes of the present invention that such time periods merely overlap, as would be understood by one of ordinary skill in the art.

As discussed in the Related Art section above, one impediment to wide acceptance of ALD processes has been the contamination problems associated therewith. For example, it is known that byproducts from the ALD process materials, such as chlorine, can remain in the processing chamber and contaminate the ALD film layer. U.S. patent application Ser. No. 11/083,899 titled A PLASMA ENHANCED ATOMIC LAYER DEPOSITION SYSTEM AND METHOD filed on Mar. 21, 2005, discusses several methods of reducing such contamination in the processing chamber. The present inventors have discovered, however, that contamination problems also result from air permeating from the external environment into the interior of the processing chamber.

As discussed above, a processing chamber is constructed of separate pieces that define an internal processing space of the chamber. In the embodiment of FIG. 2, for example, the chamber sidewall 115 is coupled to upper assembly 130 and a lower assembly 135. Further, the upper assembly 130 includes an insulating part 188 coupled to the gas injection assembly (or "showerhead assembly") 180. Conventionally, a single o-ring was provided at the coupling interfaces of these chamber parts in order to isolate an external environment from an internal space of the processing chamber. The present inventors have recognized that despite these conventional sealing efforts, external contaminants remain problematic for growing films in a PEALD chamber. Specifically, the low vacuum pressures typical of PEALD processes can cause increased permeation of external air through the chamber part interfaces. For example, during first process material injection, the vacuum pressure may be ~200 mTorr, while during second process material injection and plasma phase the vacuum pressure may be ~400 mtorr. At these pressures, for example, external air that permeates the chamber may include contaminants such as $H_2O$, $N_2$ and/or $O_2$ that can degrade the quality of the deposited ALD film. Moreover, the present inventors have recognized that even small amounts of contaminants can have an undesirable effect on PEALD films, which are typically ultra thin and have critical characteristics that must be maintained for optimum device quality and operation. This is particularly true of tantalum containing films. For example, contaminants can reduce the density of deposited films resulting in poor film characteristics such as resistivity or dielectric constant.

Figure 4:
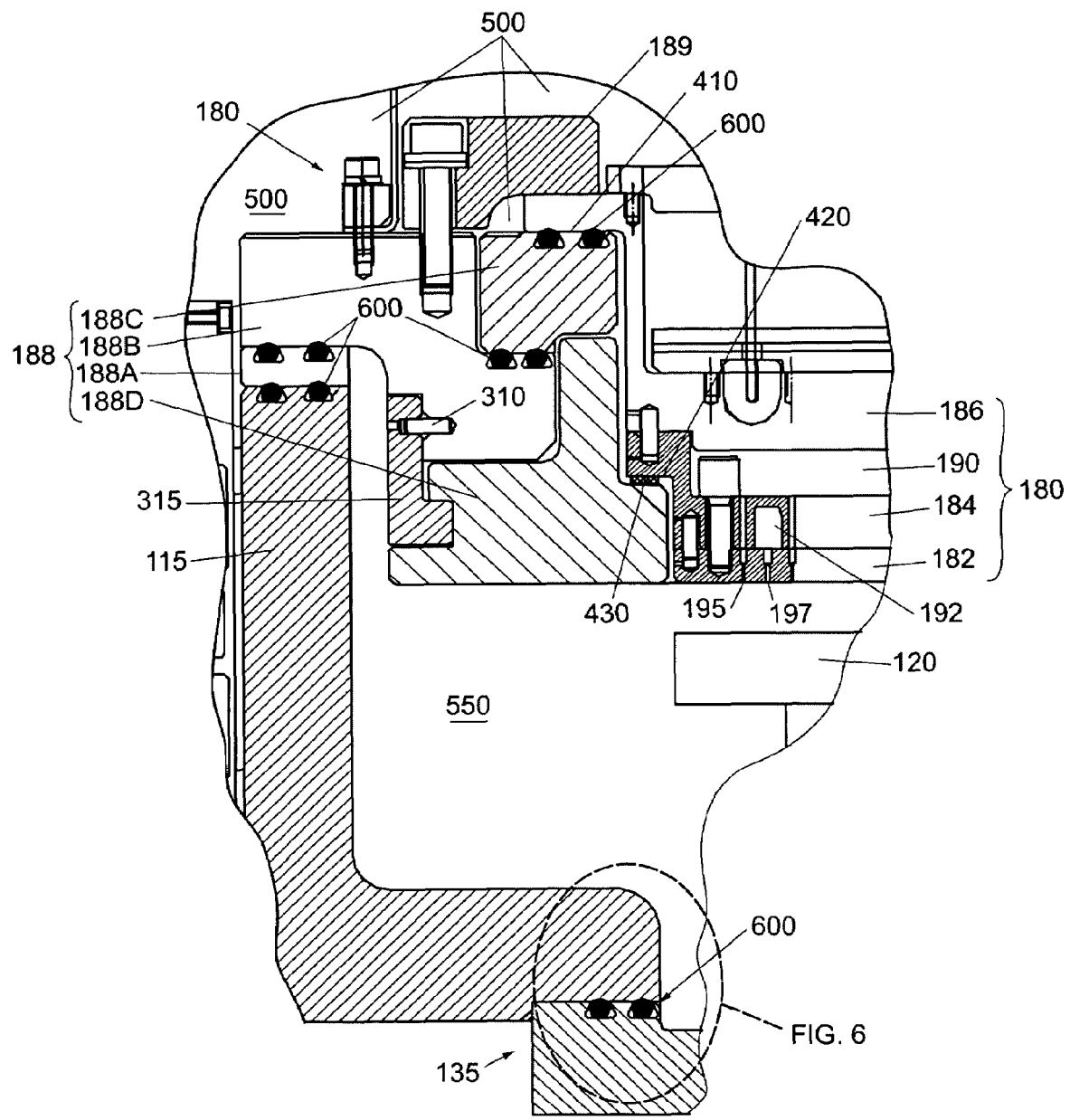
FIG. 4 is a magnified view of a portion of a processing chamber showing sealing assemblies incorporated therein in accordance with an embodiment of the present invention.

Based on recognition of these problems, the present inventors have implemented techniques for reducing the amount of external air and contaminants that permeate a PEALD processing chamber from an external environment. FIG. 4 is a magnified view of a portion of a processing chamber showing sealing assemblies incorporated therein in accordance with an embodiment of the present invention. Specifically, FIG. 4 shows the processing chamber sidewall portion 115 coupled to the showerhead assembly 180 by way of insulating member 188. The showerhead assembly 180 includes items 182, 184, 186, 190, 192, 195 and 197 described with respect to FIG. 2, and described only as necessary with respect to FIG. 4. In the embodiment of FIG. 4, the insulating assembly 188 includes spacer ring 188A, sidewall joining member 188B, an upper showerhead joining member 188C and a lower showerhead joining member 188D. One or more of these components of the insulating member 188 comprises an insulating material such as alumina or quartz in order to provide electrical insulation between the showerhead assembly 180 and the chamber sidewall 115, which are typically conductive. However, components of the insulating member 188 may be non-insulating as long as the sidewall 115 is electrically insulated from the showerhead assembly 180.

In the embodiment of FIG. 4, the spacer ring 188A is interposed between an upper surface of the chamber sidewall 115, and a lower surface of the sidewall joining member 188B. In one embodiment, the sidewall joining member 188B carries the weight of the showerhead assembly 180 and rests on the upper surface of the spacer ring 188A to provide pressure contact between the sidewall 115, spacer ring 188A and sidewall joining member 188B. In another embodiment, the pressure contact may be facilitated by a clamping device not shown in FIG. 4.

The sidewall joining member 188B is coupled to the lower showerhead joining member 188D by use of some number of fixing pins 310 and retaining ring 315. The retaining ring 315 is typically metal, but can be made of other materials. As seen in FIG. 4, the fixing pin 310 and retaining ring 315 hold a right angle surface of the lower showerhead joining member 188D in contact with a corner edge of the sidewall joining member 188B. Similarly, a corner edge of the upper showerhead joining member 188C rests in a right angle surface of the sidewall joining member 188B to maintain contact therebetween. As also shown in FIG. 4, the showerhead assembly 180 includes a first coupling surface 410 and a second coupling surface 420 that rest on horizontal surfaces of the upper showerhead joining member 188C and the lower showerhead joining member 188D respectively. The first coupling surface 410 is maintained in contact with the upper showerhead joining member 188C by a clamping member 189, and the second coupling surface 420 is maintained in contact with the lower showerhead joining member 188D by a bond 430.

In the embodiment of FIG. 4, at least five paths exist for external air and contaminants in the external environment 500 to permeate into the internal chamber environment 550. Specifically, a first permeation path exists at an interface of the chamber sidewall 115 and the spacer ring 188A, and a second permeation path exists at an interface of the chamber sidewall 115 and the lower assembly 135. Similarly, external air and contaminants can permeate through a third permeation path at the interface of the spacer ring 188A and the chamber sidewall joining member 188B. A fourth more complex permeation path travels along the interface of the sidewall joining member 188B and the upper showerhead joining member 188C, then along the interface of the sidewall joining member 188B and the lower showerhead joining member 188D, and finally along the interface between the retaining ring 315 and the lower showerhead joining member 188D and into the internal chamber space 550. Finally a fifth permeation path travels along the interface of the coupling surface 410 and the upper showerhead joining assembly 188C, then along the interface between the upper showerhead joining member 188C and the showerhead assembly 188, then along the interface of the upper showerhead joining member 188C and the lower showerhead joining member 188D, and finally along the corner edge of the sidewall joining member and along the retaining ring 315 and into the chamber space 550 as previously described.

As seen in FIG. 4, a sealing assembly 600 is provided along each of the above described permeation paths to reduce permeation of contaminants from the external environment 500 into the interior 550 of the PEALD chamber 110. Each sealing assembly 600 includes a plurality of sealing members (two shown in FIG. 4). Based on the recognition of contamination problems in a PEALD chamber as discussed above, the present inventors have recognized that the use of a sealing assembly having a plurality of sealing members can reduce contamination of the ALD film to acceptable levels, resulting in improved ALD film characteristics. While a plurality of sealing assemblies 600 are shown at various coupling points in FIG. 4, this is not required for the present invention. For example, a sealing assembly 600 having a plurality of sealing members can be provided only at a coupling point determined to be most problematic for external contamination.

Figure 5:
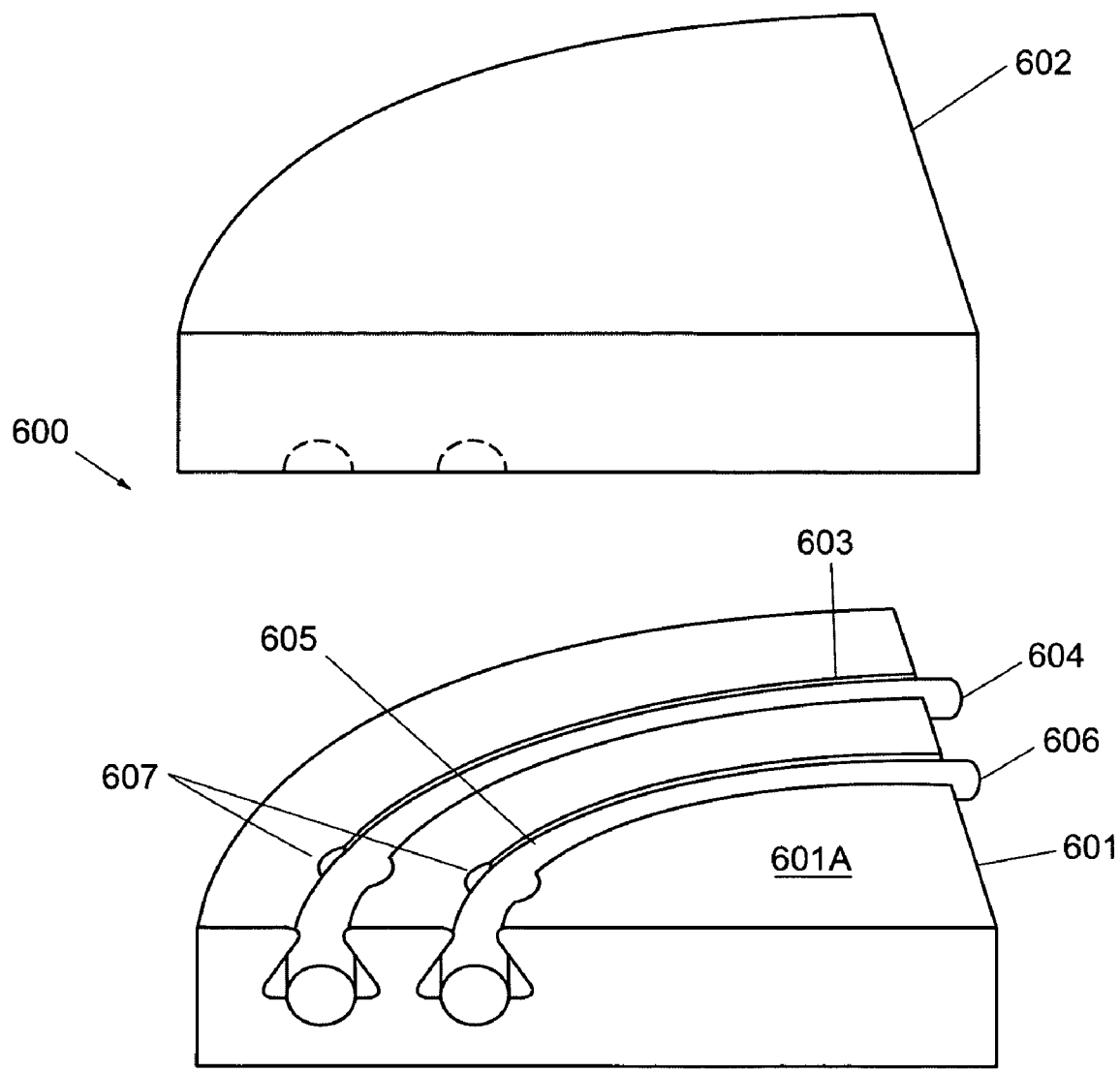
FIG. 5 shows a detailed perspective view of a sealing assembly in accordance with one embodiment of the invention.

FIG. 5 shows a detailed perspective view of a sealing assembly 600 in accordance with one embodiment of the invention. As seen in this figure, a first part 601 includes a first surface 601A that cooperates in contact with a second part 602. The first and second parts may be any of the adjacent chamber parts having a sealing assembly therebetween as discussed in FIG. 4. In the embodiment of FIG. 4, a surface 601A of the first part includes a first groove 603 having a first sealing member 604 secured therein, and a second groove 605 having a second sealing member 606 secured therein. As illustrated in FIG. 5, for the connection of two cylindrical components 601 and 602, these grooves 603 and 605 are substantially circular and substantially concentric about a center of the surface 601A. However, the sealing members can be non-circular shapes. Moreover, while the grooves 603 and 605 are shown formed in the first part 601, each groove may alternatively be formed in the second part 602, or the grooves can be partially formed in the first and second parts as indicated by the phantom grooves in the second part 602.

As also shown in FIG. 5, the grooves include a dovetail as shown by the groove 605 securing the sealing member 606, and by the groove 603 securing sealing member 604. The grooves 603 and 605 will be narrower where the groove is coplanar with the mating surface 601A. Therefore, dovetail grooves have the advantage of being able to secure a sealing member inside, while allowing an upper portion of the sealing member to protrude out of the groove and contact the surface of another mating part and allowing the sealing member to spread out within the groove under compression. Thus, when the mating parts 601 an 602 are brought together, a seal of an interior region (such as a chamber processing space) from an exterior region (exterior to the chamber) is formed where the sealing members contact the surfaces of the groove and the second mating part.

As also seen in FIG. 5, the grooves 603 and 605 also include a groove relief 607 in order to be able to extract the sealing member. A groove relief is a discontinuity in the groove at a particular point, and appears wider than the rest of the groove. Without the groove relief 607, removal of the sealing member is more difficult. In fact, the removal of the sealing member 606 from groove 605 without the groove relief 607 can cause damage to the sealing member 606 and/or the groove 605 that may disrupt the vacuum integrity of the mated components.

Sealing members 604 and 606 typically comprise a known o-ring configuration having a cross sectional shape that is substantially circular. The sealing member can be made of an elastomer material (e.g., fluorosilicone, nitrile, fluorocarbon, silicone, neoprene, ethylene propylene, etc.). These materials are generally selected per application based upon the following physical characteristics: resistance to fluid, hardness, toughness, tensile strength, elongation, o-ring compression force, modulus, tear resistance, abrasion resistance, volume change, compression set, thermal effects, resilience, deterioration, corrosion, permeability, coefficient of friction, coefficient of thermal expansion, outgas rates, etc.

Figure 6A:
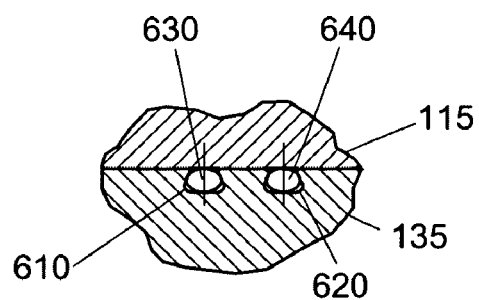
FIGS. 6A, 6B and 6C are cross sectional views showing a sealing assembly according to different embodiments of the present invention.
Figure 6B:
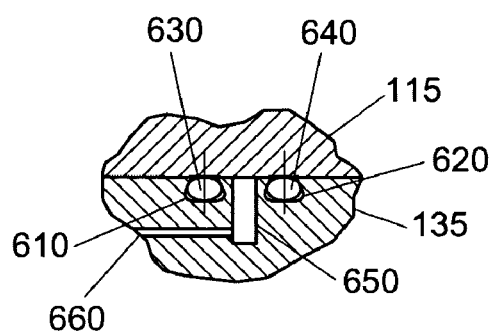
Figure 6C:
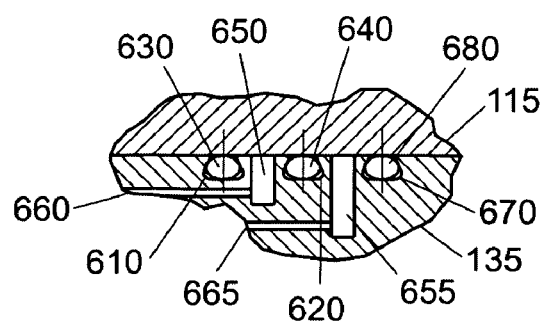

FIGS. 6A, 6B and 6C are cross sectional views showing a sealing assembly according to different embodiments of the present invention. While these figures are shown in relation to the interface of the sidewall 115 and the lower assembly 135, the embodiments of FIGS. 6A, 6B and 6C can be implemented at any of the interfaces discussed above. In the embodiment of FIG. 6A, the sealing assembly includes first and second dovetail grooves 610 and 620 formed in the lower assembly 135 and having first and second sealing members 630 and 640 formed therein respectively. This configuration of double sealing members provides reduced permeation of external air and contaminants into the PEALD processing chamber.

FIG. 6B shows a similar configuration as FIG. 6A except that a cavity 650 is included between the first and second dovetail grooves 610 and 620. The cavity 650 is shown as a groove having a rectangular cross section, but may have different cross-sectional shapes. Moreover, the cavity 650 may have various sizes. For example, the cavity may be approximately 1-10 mm in width. The cavity 650 is in communication with an interface of the chamber sidewall part 115 and the lower assembly 135. Therefore, any external air and contaminants permeating through this interface will encounter the cavity 650. A passage 660 couples the cavity 650 to an exterior portion of the lower assembly part 135 so that an environment within the cavity can be altered to reduce the amount of contaminants that permeate into the chamber. Specifically, the passage 660 may be coupled to a vacuum pump, such as that described in FIGS. 1 and 2, for creating a vacuum in cavity 650. Thus, external air and contaminants that are able to penetrate the sealing member 610 can be evacuated before penetrating the sealing member 620 to enter the chamber. As another example, the passage 660 may be coupled to an inert gas source which provides pressure in the cavity 650 to block or reduce the amount of external air and contaminants that permeate the sealing member 610. Reactive gasses may also be provided within the cavity 650 to reduce the affects of particular contaminants that enter the cavity.

FIG. 6C shows another embodiment of the invention having three concentric sealing members with a cavity interposed between adjacent sealing members. Specifically, In addition the components described in FIG. 6B, the embodiment of FIG. 6C includes groove 670 having sealing member 680 secured therein, and cavity 655 interposed between sealing members 640 and 680. A passage 665 couples the cavity 655 to an exterior portion of the lower assembly part 135 so that an environment within the cavity can be altered to reduce the amount of contaminants that permeate into the chamber 110. The environment of cavities 650 and 655 may be the same or different from one another. For example, the cavity 650 may be under vacuum pressure, while the cavity 655 includes pressurized inert gas. In addition, any number of sealing members and cavities can be used to further reduce the contaminants entering the processing chamber.

Figure 7:
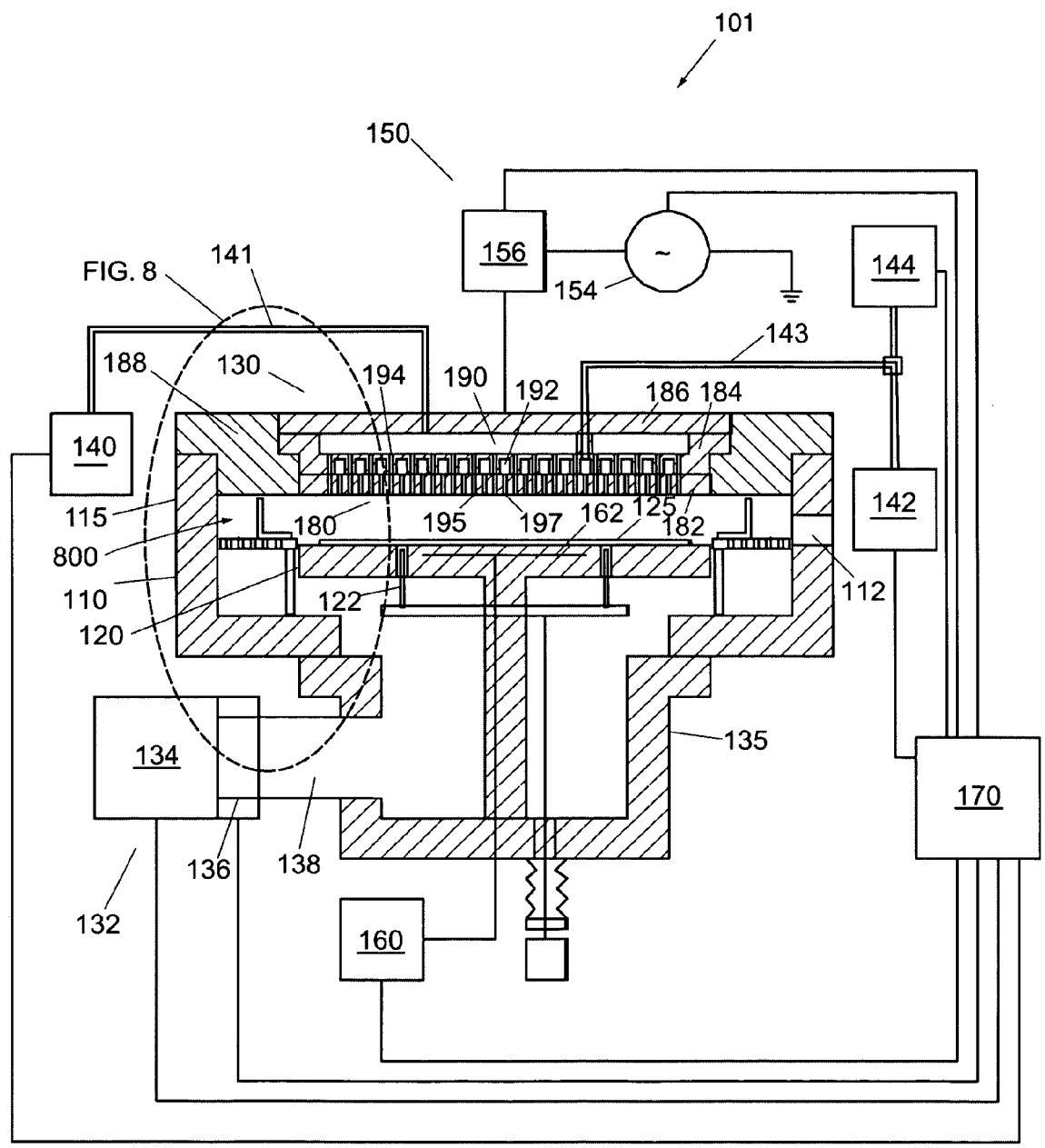
FIG. 7 is a deposition system having a contaminant shield in accordance with an embodiment of the present invention.

Apart from the improved sealing assemblies discussed above, the present inventors have discovered that contaminants that actually do permeate a PEALD processing chamber can be prevented or impeded from reaching the substrate by use of a shield mechanism. FIG. 7 is a deposition system 101 having a contaminant shield in accordance with an embodiment of the present invention. The processing chamber of FIG. 7 is identical to that of FIG. 2 except that the chamber of FIG. 7 includes a contaminant shield assembly 800. As seen in FIG. 7, the contaminant shield assembly 800 is positioned around a peripheral edge of the substrate holder 120. Thus, the shield assembly 800 is cylindrical in shape and substantially concentric with the substrate holder 120. While not shown in FIG. 7, the shield assembly 800 includes a slot in the area of the chamber passage 112 so that substrate wafers to be processed can be passed through the shield assembly 800 and placed on the substrate holder 120 for processing. The contaminant shield assembly 800 functions as a barrier to external contaminants that enter the processing chamber 110 through an interface of the sidewall 115, thereby impeding the contaminants from reaching the substrate 125 where an ALD film formed thereon can be damaged.

Figure 8:
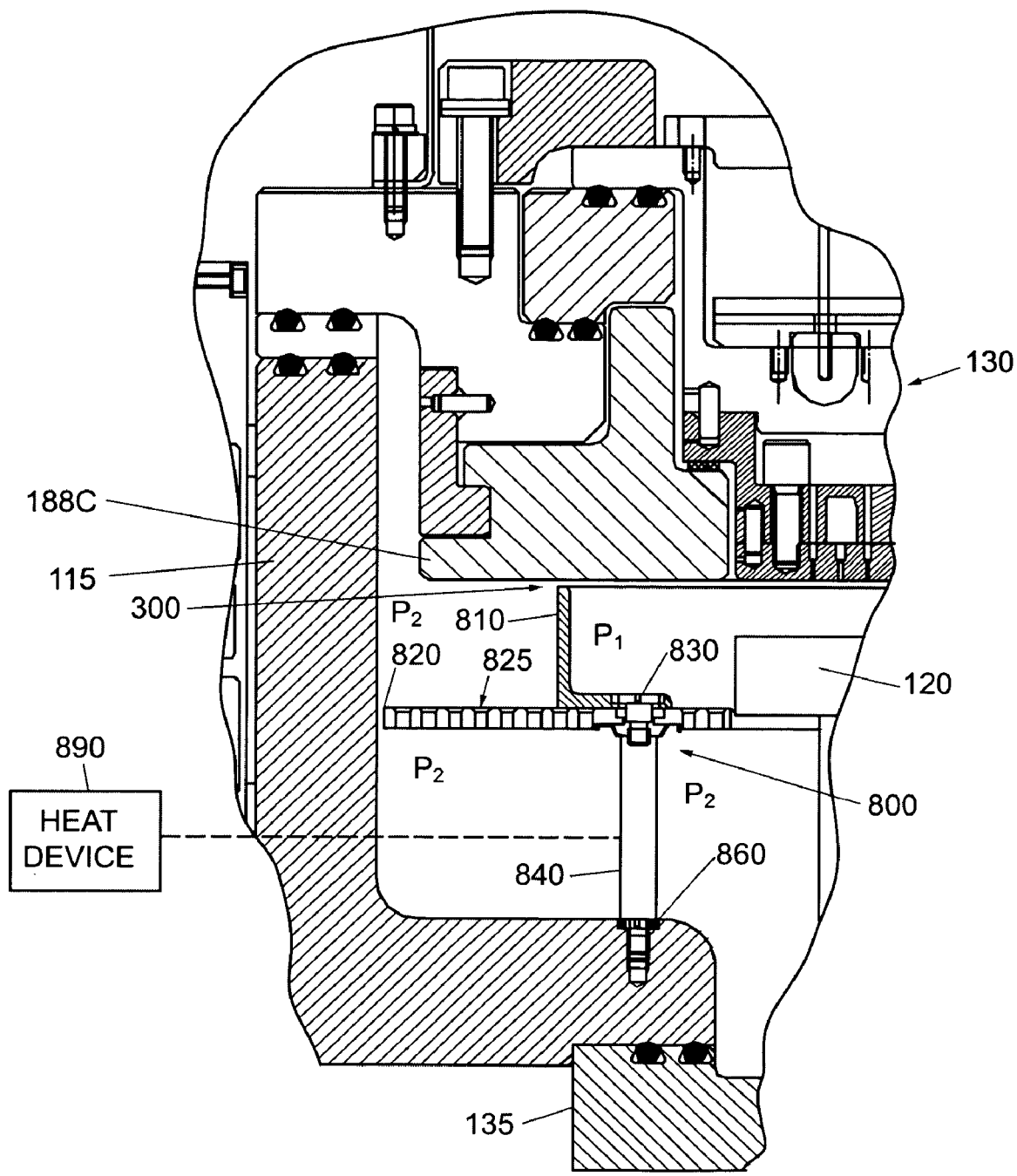
FIG. 8 is a magnified view of a portion of a processing chamber showing a contaminant shield incorporated therein in accordance with an embodiment of the present invention.

FIG. 8 is a magnified view of a portion of a processing chamber showing a contaminant shield incorporated therein in accordance with an embodiment of the present invention. FIG. 8 includes similar components as that described in FIG. 4 and therefore only those components necessary to describe the embodiment of FIG. 8 are now discussed. The shield assembly 800 includes a shield member 810, a baffle plate 820 and a mounting mechanism 840. In the embodiment of FIG. 8, the shield assembly 800 is fixed to a lower horizontal portion of the sidewall 115 by mounting screw 860 projecting through the bottom of the mounting mechanism 840. As with the shield member 810, the mounting mechanism 840 is cylindrical in shape, and prefereably includes a plurality of mounting screws 860 positioned circumferentially around the mounting mechanism 840. Alternately mounting mechanism 840 may have some finite number of cylindrical posts, each with mounting threads projecting from the bottom. In alternate embodiments, the shield may be mounted to the chamber by other means such as coupling to the vertical portion of the chamber sidewall 115, coupling to the lower assembly 135 and/or coupling to the upper assembly 130. Moreover, the shield assembly 800 may be coupled to the substrate holder 120 rather than the processing chamber itself.

While not shown in FIG. 8, the mounting assembly 840 may be adjustable to accommodate different size shields 810 and/or different sizes of the processing space between the upper assembly 130 and substrate holder 120. In addition, while the processing chamber of FIG. 8 includes the sealing assemblies discussed above, these are not required to realize the benefits of the contaminant shield embodiment of the invention. Indeed, the present inventors have also recognized that the contaminant shield assembly 800 can actually minimize the permeation of contamination through conventional sealing assemblies. Specifically, the placement of the shield assembly 800 tends to reduce the heating effects of the plasma on the chamber sidewall 115. As such, shielding the chamber sidewall 115, from excessive temperatures also allows shielding associated sealing member 600 from excessive heat loads, which can compromise material properties of the sealing member 600 to the point of seal leakage or failure.

Baffle plate 820 is coupled to a top end of the mounting mechanism 840. The baffle plate 820 is positioned substantially at a right angle to the mounting mechanism 840 and extends toward the sidewall 115 of the processing chamber. As seen in FIG. 8, the baffle plate 820 includes a plurality of through holes 825 that allow process gases to flow through the baffle plate so that the substrate region can be evacuated. In the embodiment of FIG. 8, the shield member 810 has an L-shaped cross section, the horizontal portion of which rests on the baffle plate 820. A mounting screw 830 extends through the L-shaped shield 810 and the baffle plate 820 to engage the top of the mounting mechanism 840. Thus, the shield 810 functions as an integral unit of the shield assembly 800 coupled to the sidewall 115.

As seen in FIG. 8, the shield 810 is positioned in close proximity to the upper assembly such that a gap 300 exists between the shield 810 and the lower showerhead joining member 188C. The gap 300 may be approximately 0.5 mm, and is preferably 1.0 mm. The gap size is selected to provide adequate shielding of contaminants while ensuring that no portion of the shield 810 contacts the member 188C of the upper assembly 130. As also seen in FIG. 8, the pressure in a process region is maintained at $P_1$, while pressure outside this region is maintained at $P_2$, in one embodiment of the invention. The pressure $P_1$ can be maintained higher than the pressure $P_2$ in order to impede the permeation of contaminants that enter the chamber from permeating the shield 810. In this embodiment, the gap 300 may also be selected to help maintain pressure $P_1$ higher than pressure $P_2$.

Figure 9:
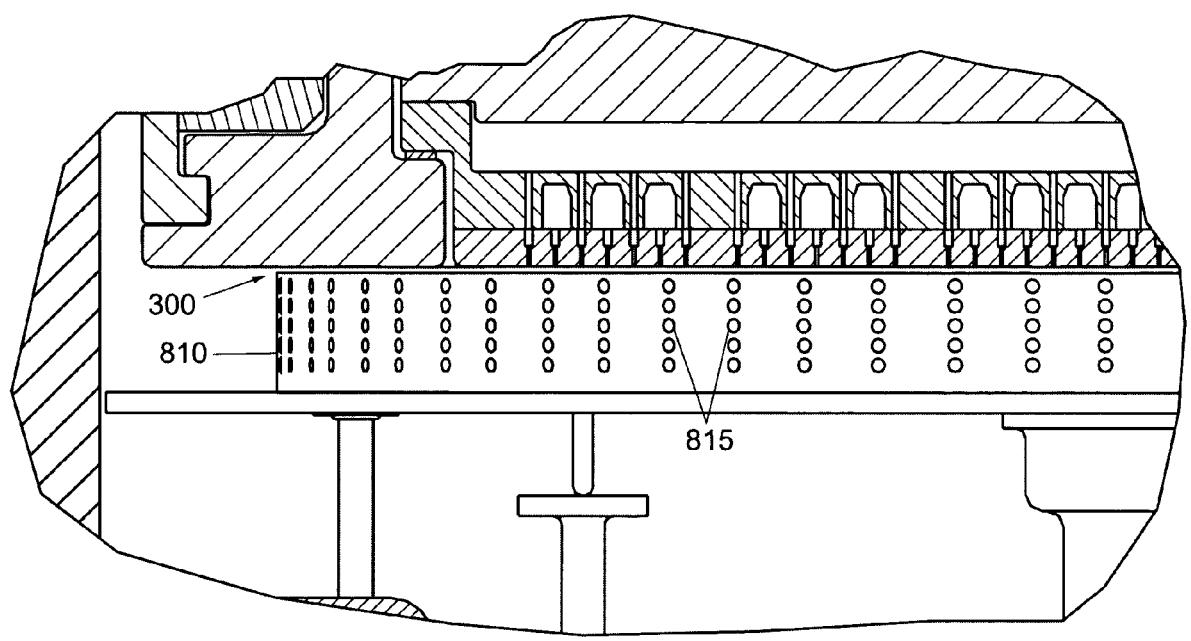
FIG. 9 shows a side view of the shield member in accordance with an embodiment of the invention.

FIG. 9 shows a side view of the shield member 810 in accordance with an embodiment of the invention. As seen in FIG. 9, the shield includes a plurality of holes 815 that permit process gas flow through the shield 810. While shown in a series of arrays, the holes 815 may be arranged more randomly on the shield 810. The holes are preferably sized to permit adequate process gas flow from the substrate region in order to evacuate this region when necessary, while also providing adequate blocking of contaminants entering the chamber from the sidewall 115. For example, the holes 815 may be from approximately 0.5 to approximately 0.15 mm in diameter, or larger. Moreover, the holes 815 are typically high aspect ratio holes (ratio of length to diameter of 2:1, 3:1, 4:1 (or more) dependent on process) that allow pumping of process gases but will not let plasma through the hole, into pumping areas. However, the hole sizes and aspect ratios may vary depending on the type of PEALD process performed in the processing chamber.

The shield member 810 may be made of metallic material. The metallic material can be aluminum or stainless steel. The metallic material may be partially or completely coated or uncoated. If metallic material is coated, the coating may be an anodic layer. The coating may be plasma resistant coating made from at least one of a III-column element (at least one of Yttrium, Scandium, and Lanthanum) and a Lanthanon element (at least on e of Cerium, Dysprosium and Europium). The plasma resistant coating may be made from at least one of $Y_2SO_3$, $Sc_2O_3$, $SC_2F_3$, $YF_3$, $La_2O_3$, $CeO_2$, $Eu_2O_3$, and $DyO_3$. Additionally, the shield member 810 may be constructed of a dielectric material or materials, or constructed of a partially dielectric and partially metallic structure, partially or fully coated or not, The dielectric material can be made from at least one of ceramic, quartz, silicon, silicon nitride, sapphire, polyimide, and silicon carbide.

The shield member 810 is preferably maintained at a temperature higher than a process temperature within the PEALD processing chamber in order to minimize deposition of materials on the shielding member 810. Specifically, the shielding member 810 is preferably maintained at a temperature to facilitate decomposition of first and second process materials and minimize a reduction reaction on the shielding member surface. In one embodiment, the shield is positioned such that a plasma generated in the process chamber heats the shield member 810 to a desired temperature. In another embodiment, the shield member 810 may be heated by an active heating device 890 such as a resistive heater as shown in FIG. 8. The resistive heater may be coupled to the shield member 810 directly, and may be part of the heating systems described with respect to FIGS. 1 and 2 above. Known alternative heating mechanisms may also be used.

Figure 10:
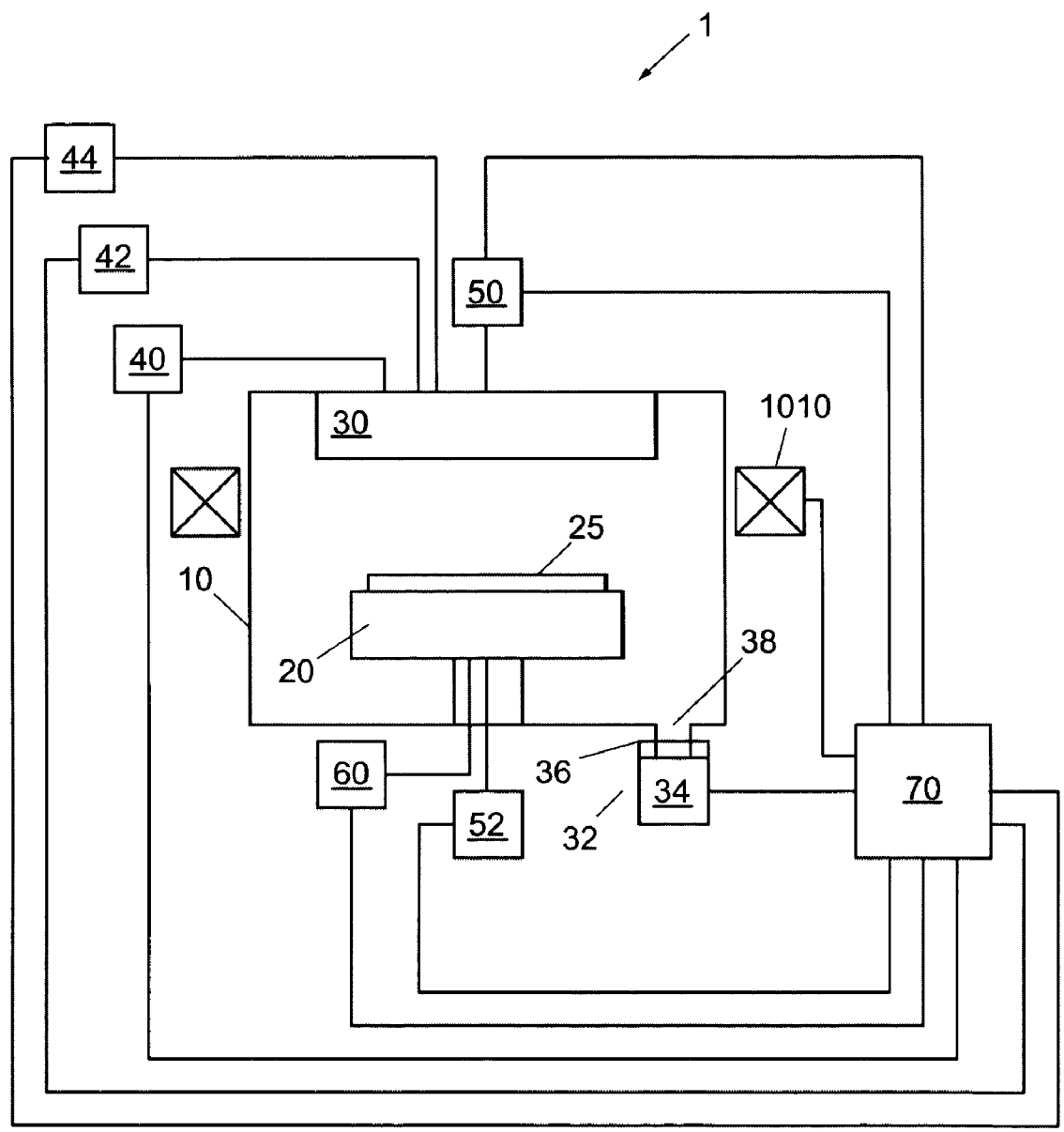
FIG. 10 shows a PEALD plasma processing system according to another embodiment of the present invention.

While embodiments of the present invention have been described with respect to processing chambers 1 and 110, the present invention may be implemented on other PEALD chamber configurations. For example, FIG. 10 shows a PEALD plasma processing system according to another embodiment of the present invention. The plasma processing system 1 of this figure is similar to that of FIG. 1, except the system of FIG. 10 includes a RF plasma source comprising either a mechanically or electrically rotating DC magnetic field system 1010. Such a structure may be used to potentially increase plasma density and/or improve plasma processing uniformity. Moreover, the controller 70 is coupled to the rotating magnetic field system 1010 in order to regulate the speed of rotation and field strength.

Figure 11:
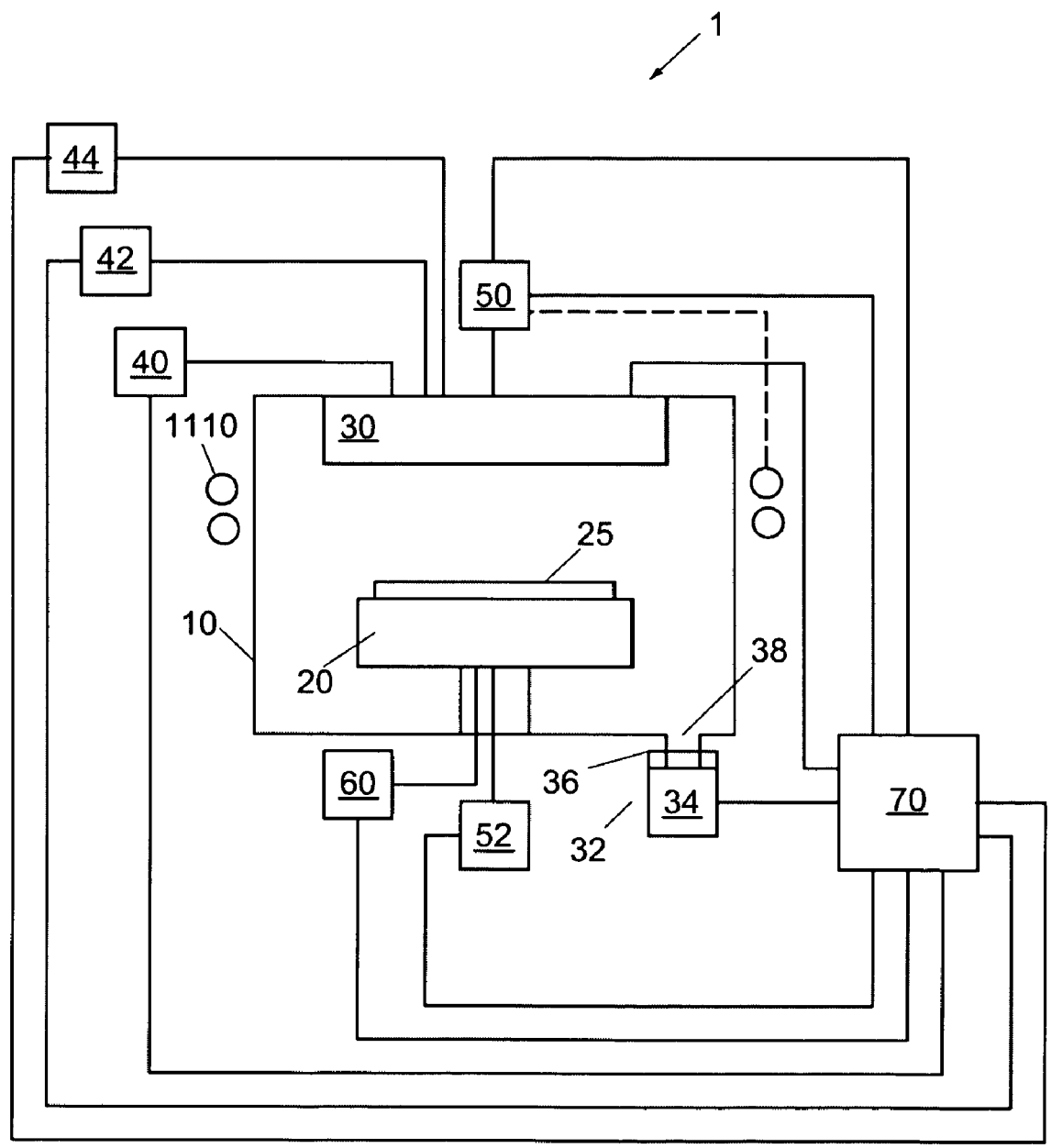
FIG. 11 shows a PEALD plasma processing system according to yet another embodiment of the present invention.

FIG. 11 shows a PEALD plasma processing system according to yet another embodiment of the present invention. The plasma processing system 1 of this figure is similar to that of FIG. 1, except the system of FIG. 11 includes a RF plasma source comprising an inductive coil 1110 to which RF power is coupled via a power source 50. RF power is inductively coupled from the inductive coil 1110 through a dielectric window (not shown) to the plasma-processing region above the substrate 25. A typical frequency for the application of RF power to the inductive coil 1110 ranges from 0.1 MHz to 100 MHz and can be 13.56 MHz. The RF power applied to the inductive coil can be between about 50 W and about 10000 W. Similarly, a typical frequency for the application of power to the chuck electrode ranges from 0.1 MHz to 30 MHz and can be 13.56 MHz. The RF power applied to the substrate holder can be between about 0 W and about 1000 W. In addition, a slotted Faraday shield (not shown) can be employed to reduce capacitive coupling between the inductive coil 80 and plasma. Moreover, the controller 70 is coupled to the power source 50 in order to control the application of power to the inductive coil 1110.

Although only certain exemplary embodiments of inventions have been described in detail above, those skilled in the art will readily appreciate that many modifications are possible in the exemplary embodiments without materially departing from the novel teachings and advantages of this invention. For example, various techniques have been disclosed herein for reducing contamination of ALD films. Any combination or all of these features can be implemented in a single PEALD processing system. Accordingly, all such modifications are intended to be included within the scope of this invention.

The invention claimed is:
1. A plasma enhanced atomic layer deposition (PEALD) system comprising:
an upper chamber assembly coupled to a chamber sidewall at an upper interface and a lower chamber assembly coupled to the chamber sidewall at a lower interface to provide a processing chamber defining an isolated processing space within the processing chamber;
a substrate holder provided within said processing chamber, and configured to support a substrate;
a first process material supply system configured to supply a first process material to said processing chamber;
a second process material supply system configured to supply a second process material to said processing chamber; and
a power source configured to couple electromagnetic power to the processing chamber,
wherein the upper interface or the lower interface or the upper interface and the lower interface include a sealing assembly comprising a plurality of elastomer sealing members configured to reduce the amount of external contaminants permeating through the upper or lower interfaces, respectively, into said isolated processing space of the processing chamber, wherein a film is formed on said substrate by alternatingly introducing said first process material and said second process material,
wherein said sealing assembly comprises:
a first discrete groove formed in a surface of said upper chamber assembly or said chamber sidewall or said upper chamber assembly and said chamber sidewall, or in a surface of said chamber sidewall or said lower chamber assembly or said chamber sidewall and said lower chamber assembly and configured to secure a first sealing member therein; and
a second discrete groove formed in a surface of said upper chamber assembly or said chamber sidewall or said upper chamber assembly and said chamber sidewall, or in a surface of said chamber sidewall or said lower chamber assembly or said chamber sidewall and said lower chamber assembly adjacent to said first groove, said second groove configured to secure a second sealing member therein, said PEALD system further comprising:
a first discrete cavity formed in said upper chamber assembly or said chamber sidewall or said upper chamber assembly and said chamber sidewall, or in a surface of said chamber sidewall or said lower chamber assembly or said chamber sidewall and said lower chamber assembly, and coupled to the upper or lower interfaces, respectively, at a position between said first and second grooves;
a first passage coupled from said first cavity to an inert gas source that supplies an inert gas at a positive pressure to said first cavity in order to block or reduce external air and contaminants;
a third discrete groove formed in at least one of said upper chamber assembly or said chamber sidewall or said upper chamber assembly and said chamber sidewall, or in a surface of said chamber sidewall or said lower chamber assembly or said chamber sidewall and said lower chamber assembly;
a third sealing member secured in said third groove;
a second discrete cavity formed in said upper chamber assembly or said chamber sidewall or said upper chamber assembly and said chamber sidewall, or in a surface of said chamber sidewall or said lower chamber assem- bly or said chamber sidewall and said lower chamber assembly, and coupled to the upper or lower interfaces, respectively, at a position between said second and third grooves; and a second passage coupled from said second cavity to a vacuum pump that evacuates said second cavity such that said external air and said contaminants are evacuated from said second cavity, wherein the first discrete cavity is closer to the processing chamber than the second discrete cavity.

2. The PEALD system of claim 1, wherein said upper interface comprises an interface between said chamber sidewall and a spacer ring, wherein the interface between said chamber sidewall and said spacer ring includes a second sealing assembly comprising a second plurality of elastomer sealing members configured to reduce the amount of external contaminants permeating through the interface between said chamber sidewall and said spacer ring into said isolated processing space of the processing chamber.

3. The PEALD system of claim 2, wherein said upper interface further comprises an interface between said spacer ring and a sidewall joining member, wherein the interface between said spacer ring and said sidewall joining member includes a third sealing assembly comprising a third plurality of elastomer sealing members configured to reduce the amount of external contaminants permeating through the interface between said spacer ring and said sidewall joining member into said isolated processing space of the processing chamber.

4. The PEALD system of claim 3, wherein said upper interface further comprises an interface between said sidewall joining member and an upper showerhead joining member, wherein the interface between said sidewall joining member and said upper showerhead joining member includes a fourth sealing assembly comprising a fourth plurality of elastomer sealing members configured to reduce the amount of external contaminants permeating through the interface between said sidewall joining member and said upper showerhead joining member into said isolated processing space of the processing chamber.

5. The PEALD system of claim 4, wherein said upper interface further comprises an interface between said upper showerhead joining member and a showerhead assembly, wherein the interface between said upper showerhead joining member and said showerhead assembly includes a fifth sealing assembly comprising a fifth plurality of sealing members configured to reduce the amount of external contaminants permeating through the interface between said upper showerhead joining member and said showerhead assembly into said isolated processing space of the processing chamber.

6. The PEALD system of claim 1, wherein said first process material supply system is configured to introduce a first process material comprising at least one of $TaF_5$, $TaCl_5$, $TaBr_5$, $TaI_5$, $Ta(CO)_5$, PEMAT, PDMAT, PDEAT, TBTDET, $Ta(NC_2H_5)(N(C_2H_5)_2)_3$, $Ta(NC(CH_3)_2C_2H_5)(N(CH_3)_2)_3$, $Ta(NC(CH_3)_3)(N(CH_3)_2)_3$, $TiF_4$, $TiCl_4$, $TiBr_4$, $TiI_4$, TEMAT, TDMAT, TDEAT, $Ti(NO_3)$, $WF_6$, $W(CO)_6$, $MoF_6$, $Cu(TMVS)(hfac)$, $CuCl$, $Zr(NO_3)_4$, $ZrCl_4$, $Hf(OBut)_4$, $Hf(NO_3)_4$, $HfCl_4$, $NbCl_5$, $ZnCl_2$, $Si(OC_2H_5)_4$, $Si(NO_3)_4$, $SiCl_4$, $SiH_2Cl_2$, $Al_2Cl_6$, $Al(CH_3)_3$, $Ga(NO_3)_3$, or $Ga(CH_3)_3$.

7. The PEALD system of claim 1, wherein said first process material supply system is configured to introduce a second process material comprising at least one of $H_2$, $N_2$, $O_2$, $H_2O$, $NH_3$, $H_2O_2$, $SiH_4$, $Si_2H_6$, $NH(CH_3)_2$, or $N_2H_3CH_3$.

8. The PEALD system of claim 1, wherein at least one of said first and second grooves comprises a dovetail groove.

9. The PEALD system of claim 1, wherein at least one of said first and second grooves comprises a groove relief for facilitating removal of at least one of said first and second sealing members.

10. The PEALD system of claim 1, wherein at least one of said first and second sealing members comprises an o-ring that is substantially circular in an azimuthal direction.

11. The PEALD system of claim 10, wherein said o-ring has a substantially circular cross-sectional shape.

12. The PEALD system of claim 1, wherein at least one of said sealing members comprises an elastomer material including at least one of fluorosilicone, nitrile, fluorocarbon, silicone, neoprene, or ethylene propylene.

13. The PEALD system of claim 12, wherein said elastomer material is selected based upon at least one of the following physical characteristics: resistance to fluid, hardness, toughness, tensile strength, elongation, o-ring compression force, modulus, tear resistance, abrasion resistance, volume change, compression set, thermal effects, resilience, deterioration, corrosion, permeability, coefficient of friction, coefficient of thermal expansion or outgas rates.

14. The PEALD system of claim 1, wherein said power source comprises a gas injection electrode having a plurality of orifices coupled to at least one of said first process material supply system or said second process material supply system.

15. The PEALD system of claim 1, wherein said power source comprises a gas injection electrode having a plurality of sets of orifices, each set being coupled to a different one of said first process material supply system and said second process material supply system.

16. The PEALD system of claim 1, further comprising a contaminant shield positioned along a periphery of said substrate holder and configured to impede external contaminants that permeate said chamber from traveling to a region of said substrate holder.

17. The PEALD system of claim 16, wherein said contaminant shield member is positioned to facilitate plasma heating of the contaminant shield to a temperature greater than a process temperature.

18. The PEALD system of claim 16, further comprising a heating device coupled to said contaminant shield and configured to heat the contaminant shield to a temperature greater than a temperature of a process performed in said chamber.

19. The PEALD system of claim 16, further comprising a heating device coupled to said shield member and configured to heat the contaminant shield to a temperature 10° C. higher than a process temperature.

20. A plasma enhanced atomic layer deposition (PEALD) system comprising:

an upper chamber assembly coupled to a chamber sidewall at an upper interface and a lower chamber assembly coupled to the chamber sidewall at a lower interface to provide a processing chamber defining an isolated processing space within the processing chamber;

means provided within said processing chamber for supporting a substrate;

means for supplying a first process material to said processing chamber;

means for supplying a second process material to said processing chamber; and means for generating and coupling electromagnetic power to the processing chamber while said second process material supply system supplies the second process material to the process chamber, in order to accelerate a reduction reaction at a surface of said substrate, wherein the upper interface or the lower interface or the upper interface and the lower interface include means for sealing to reduce the amount of external contaminants permeating through the upper or lower interfaces, respectively, into said isolated processing space of the processing chamber, wherein a film is formed on said substrate by alternatingly introducing said first process material and said second process material, and wherein said means for sealing includes a plurality of elastomer sealing members, and wherein said means for sealing comprises:

a first discrete groove formed in a surface of said upper chamber assembly or said chamber sidewall or said upper chamber assembly and said chamber sidewall, or in a surface of said chamber sidewall or said lower chamber assembly or said chamber sidewall and said lower chamber assembly and configured to secure a first sealing member therein; and a second discrete groove formed in a surface of said upper chamber assembly or said chamber sidewall or said upper chamber assembly and said chamber sidewall, or in a surface of said chamber sidewall or said lower chamber assembly or said chamber sidewall and said lower chamber assembly adjacent to said first groove, said second groove configured to secure a second sealing member therein, said PEALD system further comprising:

a first discrete cavity formed in said upper chamber assembly or said chamber sidewall or said upper chamber assembly and said chamber sidewall, or in a surface of said chamber sidewall or said lower chamber assembly or said chamber sidewall and said lower chamber assembly, and coupled to the upper or lower interfaces, respectively, at a position between said first and second grooves; and a first passage coupled from said first cavity to an inert gas source that supplies an inert gas at a positive pressure to said first cavity in order to block external air and contaminants;

a third discrete groove formed in at least one of said upper chamber assembly or said chamber sidewall or said upper chamber assembly and said chamber sidewall, or in a surface of said chamber sidewall or said lower chamber assembly or said chamber sidewall and said lower chamber assembly;

a third sealing member secured in said third groove;

a second discrete cavity formed in said upper chamber assembly or said chamber sidewall or said upper chamber assembly and said chamber sidewall, or in a surface of said chamber sidewall or said lower chamber assembly or said chamber sidewall and said lower chamber assembly, and coupled to the upper or lower interfaces, respectively, at a position between said second and third grooves; and a second passage coupled from said second cavity to a vacuum pump that evacuates said second cavity such that said external air and said contaminants are evacuated from said second cavity, wherein the first discrete cavity is closer to the processing chamber than the second discrete cavity.

* * * * *